(12) United States Patent
Nishimoto et al.

(10) Patent No.: US 7,599,189 B2
(45) Date of Patent: Oct. 6, 2009

(54) BOARD-HOUSING CASE AND FLUID PRESSURE CONTROL DEVICE INCLUDING THEREOF

(75) Inventors: Kosei Nishimoto, Kiyosu (JP); Koji Yanai, Kariya (JP); Takahiro Naganuma, Kariya (JP)

(73) Assignee: Advics Co., Ltd., Aichi-pref. (JP)

( * ) Notice: Subject to any disclaimer, the term of this patent is extended or adjusted under 35 U.S.C. 154(b) by 90 days.

(21) Appl. No.: 12/003,873

(22) Filed: Jan. 3, 2008

(65) Prior Publication Data
US 2008/0165510 A1 Jul. 10, 2008

(30) Foreign Application Priority Data
Jan. 9, 2007 (JP) ............................. 2007-001285
Nov. 15, 2007 (JP) ............................. 2007-296747

(51) Int. Cl.
*H05K 5/00* (2006.01)
(52) U.S. Cl. ........................ 361/752; 361/796; 361/803; 361/808; 439/76.1; 439/76.2
(58) Field of Classification Search ................. 361/752, 361/796, 803–809; 439/76.1, 76.2
See application file for complete search history.

(56) References Cited

U.S. PATENT DOCUMENTS

| 5,617,301 | A * | 4/1997 | Sato et al. | 361/796 |
| 5,618,186 | A * | 4/1997 | Saka et al. | 439/76.2 |
| 7,357,650 | B2 * | 4/2008 | Sasaki et al. | 439/76.2 |
| 2004/0253850 | A1* | 12/2004 | Naitou et al. | 439/76.2 |
| 2005/0020104 | A1* | 1/2005 | Yamamoto et al. | 439/76.1 |
| 2006/0270252 | A1* | 11/2006 | Muto et al. | 439/76.2 |
| 2007/0076383 | A1* | 4/2007 | Sasaki et al. | 361/752 |

FOREIGN PATENT DOCUMENTS

JP A-2002-368452 12/2002

* cited by examiner

*Primary Examiner*—Dean A. Reichard
*Assistant Examiner*—Andargie M Aychillhum
(74) *Attorney, Agent, or Firm*—Posz Law Group, PLC

(57) ABSTRACT

A resin case main body includes a connector housing, a component housing, and a joint portion. A busbar includes a reinforcement plate portion which is orthogonal to a plane of a board and is parallel to an alignment direction of the connector housing, the joint portion, and the component housing. The reinforcement plate portion is formed by insert molding in the joint portion.

14 Claims, 16 Drawing Sheets

BOARD-HOUSING CASE AND FLUID PRESSURE CONTROL DEVICE INCLUDING THEREOF

CROSS REFERENCE TO RELATED APPLICATION

This application is based on and incorporates herein by reference Japanese patent applications No. 2007-001285 filed on Jan. 9, 2007 and No. 2007-296747 filed on Nov. 15, 2007.

FIELD OF THE INVENTION

The present invention relates to a board-housing case for accommodating a board on which an electric element is arranged. The present invention also relates to a fluid pressure control device having the board-housing case and a solenoid valve for opening and closing a fluid channel. In particular, the present invention is suitable to a fluid pressure control device for a vehicle brake system.

BACKGROUND OF THE INVENTION

FIG. 19 is a plan view showing a fluid pressure control device for a vehicle brake system of a prior art in a state where a board and a cover are removed. FIG. 20 is a cross-sectional view of the fluid pressure control device taken along a line XX-XX of FIG. 19. As shown in FIGS. 19 and 20, the fluid pressure control device for the vehicle brake system of the prior art includes a solenoid valve 2 for opening and closing a fluid channel through which brake fluid flows, a board 5 on which electronic components are arranged, a resin case 3 accommodating a solenoid 21 of the solenoid valve 2 and fixing the board 5, and the like.

The board 5 has the electronic components arranged thereon. An end of a connector terminal 6 is connected with the board 5. A plurality of mounting holes are formed at the board 5. The case 3 has a solenoid housing 32 accommodating the solenoid 21, a connector housing 33 accommodating the other end of the connector terminal 6, and a joint portion 34 through which the solenoid housing 32 is connected with the connector housing 33. A plurality of board-holding units 35 and 36 are also formed at the case 3 and inserted and fitted to the mounting holes of the board 5 so as to fix the board 5. The board-holding units 35 and 36 are respectively provided at the joint portion 34 and the solenoid housing 32. A resin cover 4 is airtightly welded to a side of the case 3 opposite to the solenoid 21. Thus, the case 3 and the cover 4 form a board housing chamber 41 in which the board 5 is installed (for example, see Japanese Unexamined Patent Application Publication No. 2002-368452).

However, since the fluid pressure control device for the vehicle brake system is generally mounted in an engine room of a vehicle, the resin case 3 may be deformed by, for example, heat generated at an engine. In particular, the connector housing 33 may noticeably warp because the connector housing 33 extends from the solenoid housing 32 in an overhanging manner.

More specifically, the case 3 may be deformed such that the connector housing 33 turns around an axis K of the joint portion 34 with respect to the solenoid housing 32. Accordingly, a solder bonding portion 8 between the connector terminal 6 and the board 5 may be displaced in an F direction.

A component in an x direction of the displacement F is restricted by the board-holding unit 35 provided at the joint portion 34. Another component in a y direction of the displacement F causes a frictional resistance between the board-holding unit 35 provided at the joint portion 34 and the board 5. As a result, stresses are generated at the solder bonding portion 8 in both the x and y directions, thereby making solder cracking more likely to occur.

In addition, a residual stress is generated in forming the case 3 and causes distortion (more specifically, warpage) of the case relative to a point close to the axis K. Therefore, it is difficult to manufacture the case 3 with high dimensional accuracy. This may harm reliability of sealing at a welded portion between the case 3 and the cover 4.

SUMMARY OF THE INVENTION

It is therefore an object of the present invention to prevent solder cracking at a bonding portion between a connector terminal and a board.

In an aspect of the present invention, a board-housing case includes a case main body to which a board is attached, on a surface of the board an electrical element being arranged, to the board an end portion of a connector terminal being connected. The case main body includes a board housing for accommodating the board; a connector housing for accommodating another end portion of the connector terminal; a component housing for accommodating component, the component housing and the connector housing being aligned in a direction parallel to a plane of the board; and a joint portion integrally formed with the connector housing and the component housing to connect the connector housing and the component housing, an external dimension of the joint portion in a direction orthogonal to the plane of the board is smaller than that of the connector housing and the component housing.

The board-housing case also includes a busbar having a board-side terminal portion connected with the board and a connector-side terminal portion located in the connector housing. The busbar includes a reinforcement plate portion. A plane of the reinforcement plate portion is non-parallel to the plane of the board, and a longitudinal direction of the reinforcement plate portion is non-parallel to a reference line, the reference line being a straight line which is parallel to the plane of the board and is orthogonal to an alignment direction of the connector housing, the joint portion, and the component housing. In addition, the reinforcement plate portion is formed by insert molding in a resin portion of the joint portion.

With this configuration, the reinforcement plate portion suppresses deformation of the case main body. Therefore, a stress generated at the joint portion is suppressed, and solder cracking at the joint portion is prevented.

In addition, the reinforcement plate portion can suppress the deformation of the case main body in forming the case main body. Therefore, it is possible to manufacture the case main body with a high dimensional accuracy.

The busbar may include a busbar main body for connecting the board-side terminal portion with the connector-side terminal portion, and the busbar main body may include the reinforcement plate portion and a non-reinforcement plate portion being parallel to the plane of the board.

Both of the non-reinforcement plate portion and the reinforcement plate portion may be formed by insert molding at least in the resin portion of the joint portion.

Otherwise, the only the reinforcement plate portion out of the non-reinforcement plate portion and the reinforcement plate portion is formed by insert molding at least in the resin portion of the joint portion.

With this configuration, the non-reinforcement plate portion is exposed at the exterior of the case main body. The non-reinforcement plate portion can therefore be easily used to support the corresponding busbar in a process of insert molding.

A portion of the busbar main body located at the joint portion may have a U-shaped cross section as viewed in the alignment direction.

Otherwise, a portion of the busbar main body located at the joint portion may have an L-shaped cross section as viewed in the alignment direction.

With this configuration, the shape of the busbar main body can be simpler than that of the busbar main body having the U-shaped cross section. As a result, a manufacturing cost of the busbar main body can be decreased.

The busbar may include a busbar main body for connecting the board-side terminal portion with the connector-side terminal portion, and the busbar main body may consist of the reinforcement plate portion at least at the joint portion.

With this configuration, each portion of the busbar main body located in the joint portion has an I-shaped cross section as viewed in the alignment direction. Therefore, the shape of the busbar main body can be simpler than that of the busbar main body having the U-shaped cross section or the L-shaped cross section. As a result, a manufacturing cost of the busbar main body can be decreased.

The entire busbar main body may consist of the reinforcement plate portion.

With this configuration, the shape of the busbar main body can be simple. As a result, a manufacturing cost of the busbar main body can be decreased.

The reinforcement plate portion may continuously extend a full width of the joint portion in the alignment direction.

With this configuration, the deformation of the case can be surely suppressed, since the reinforcement plate portion is disposed at a portion of the case where deformation occurs most likely.

The board-housing case may further include a resin cover which is connected with a side of the case main body to which the board is located, wherein the board-housing includes the case main body and the cover.

With this configuration, reliability of sealing between the case main body and the cover is improved since the cover is attached to the case main body 3 which has a high dimensional accuracy.

The fluid pressure control device may be mounted on a vehicle, and brake fluid may flow through the fluid channel.

In another aspect of the present invention, a plane of the reinforcement plate portion is non-parallel to a reference line, the reference line being a straight line which is parallel to the plane of the board and is orthogonal to an alignment direction of the connector housing, the joint portion, and the component housing.

With this configuration, the reinforcement plate portion suppresses deformation of the case main body. Therefore, a stress generated at the joint portion is suppressed, and solder cracking at the joint portion is prevented.

In addition, the reinforcement plate portion can suppress the deformation of the case main body in forming the case main body. Therefore, it is possible to manufacture the case main body with a high dimensional accuracy.

BRIEF DESCRIPTION OF THE DRAWINGS

The invention, together with additional objective, features and advantages thereof, will be best understood from the following description, the appended claims and the accompanying drawings. In the drawings:

DETAILED DESCRIPTION OF THE EMBODIMENTS

First Embodiment

A first embodiment of the present invention is described below. The fluid pressure control device including a board-housing case of this embodiment is used for a vehicle brake system that controls a braking force of a vehicle by controlling a pressure of brake fluid. Note that a vertical direction in FIG. 1 represents a vertical direction when the fluid pressure control device is mounted on the vehicle.

Figure 1:
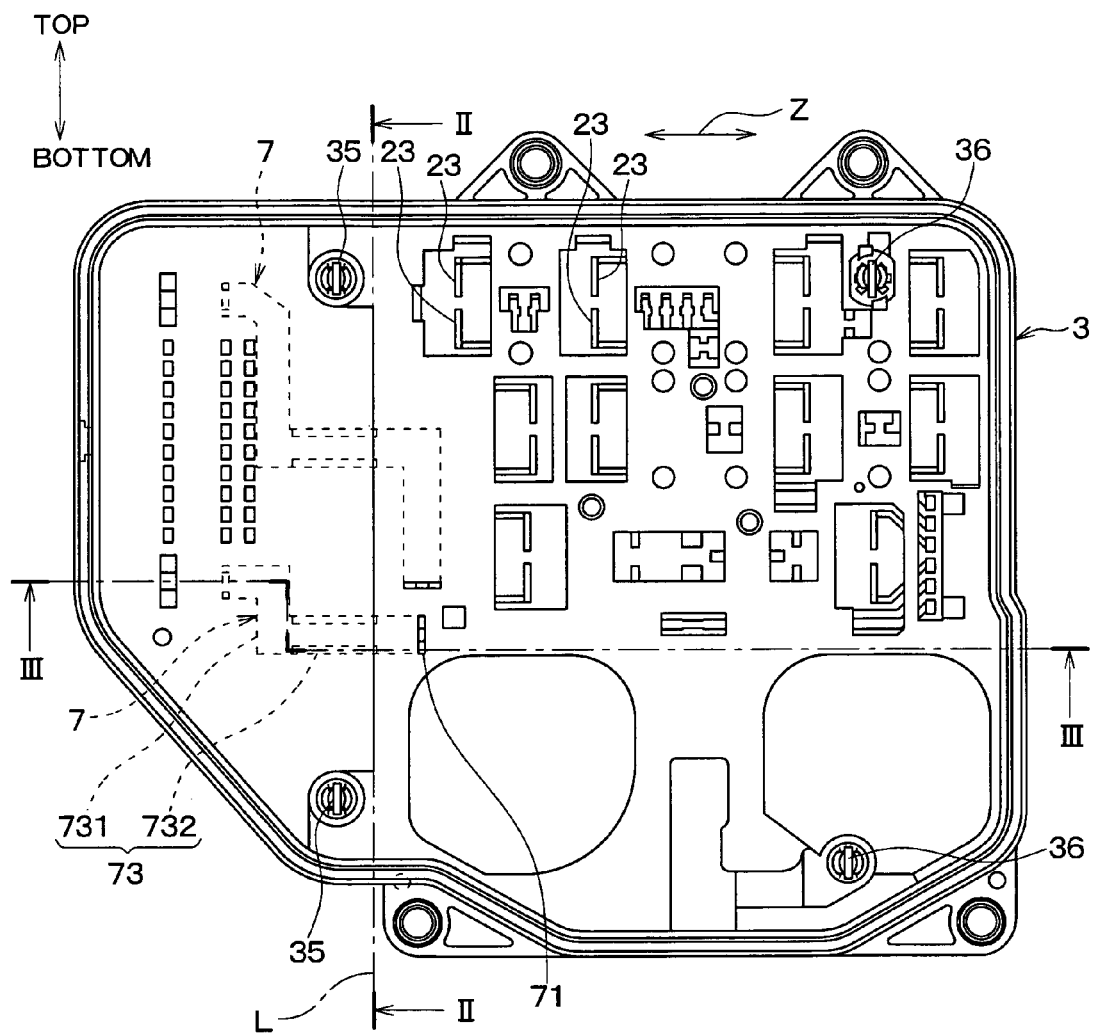
FIG. 1 is a plan view showing a fluid pressure control device including a board-housing case according to a first embodiment of the present invention in a state where a board and a cover are removed.
Figure 2:
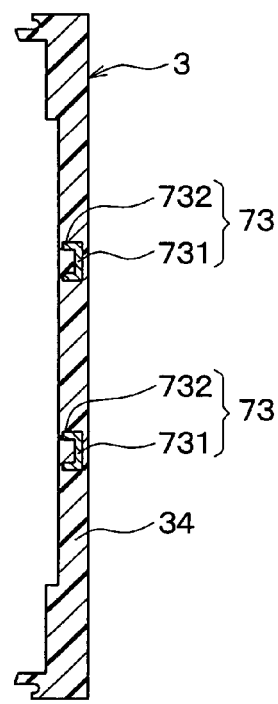
FIG. 2 is a cross sectional view taken along a line II-II of FIG. 1.
Figure 3:
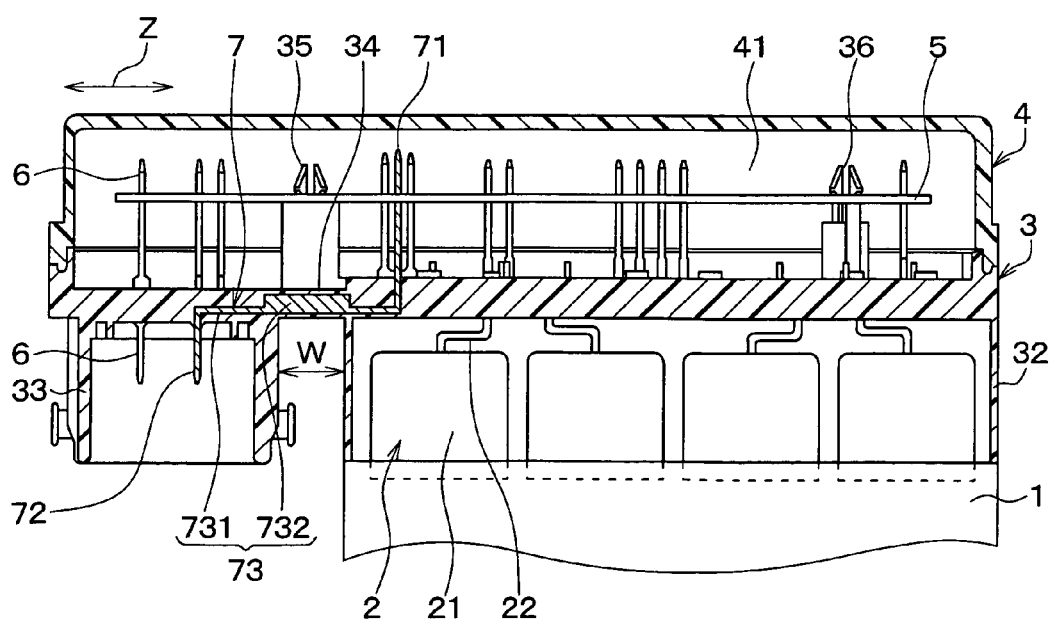
FIG. 3 is a cross sectional view taken along a line III-III of FIG. 1.

As shown in FIGS. 1 to 3, the fluid pressure control device includes a metal body 1 in which a fluid channel (not shown) through which brake fluid flows is formed. The body 1 has a plurality of solenoid valves 2 for opening and closing the fluid channel, a pump (not shown) for sucking and discharging the brake fluid, an electrical motor (not shown) for driving the pump, and the like. Thus, the solenoid valves 2 allow and block the flow of the fluid.

Solenoids 21 of the solenoid valves 2 are fixed to a side surface of the body 1 by caulking or the like. The solenoids 21 are exposed to the outside of the body 1. A main body 3 of a resin case is fixed to the body 1 using screws (not shown) to cover the solenoid 21. The main body 3 of the case is hereinafter referred to as a case main body 3.

A coil wire (not shown) of each solenoid 21 is soldered to a solenoid terminal 22. The solenoid terminal 22 is attached to an exposed portion of a conducting member 23 which is formed in the case main body 3 by insert molding.

A resin cover 4 is bonded to the case main body 3 by welding or the like on the side of the case main body 3 opposite to the body 1. The case main body 3 and the cover 4 define a board housing chamber 41. A plate-like board 5 is accommodated in the board housing chamber 41. The board 5 has electronic components (not shown) on its surface. First ends of a plurality of connector terminals 6 which are formed at the case main body 3 by insert molding are soldered to the board 5. In addition, the solenoid terminal 22 is connected with the board 5 through the conducting member 23.

The case main body 3 includes a substantially rectangular parallelepiped solenoid housing 32 providing a space for accommodating the solenoids 21, a substantially rectangular parallelepiped connector housing 33 providing a space for accommodating second ends of the connector terminals 6, and a plate-like joint portion 34 through which the solenoid housing 32 is connected with the connector housing 33. The housings 32 and 33, and the joint portion 34 are integrally formed together.

The housings 32 and 33, and the joint portion 34 are aligned in a direction (hereinafter referred to as an alignment direction Z) parallel to the board 5. An external dimension of the joint portion 34 in a direction orthogonal to the plane of the board 5 is smaller than external dimensions of the housings 32 and 33 in the direction orthogonal to the plane of the board 5.

In the case main body 3, two connector side board-holding units 35 protruding toward the board 5 are formed at positions close to the joint portion 34, and two solenoid side board-holding units 36 protruding toward the board 5 are formed at positions on the solenoid housing 32 side with respect to the joint portion 34. The connector side board-holding units 35 and the solenoid side board-holding units 36 are inserted in installation holes (not shown) of the board, and the board 5 is accordingly fixed to the case main body 3.

In addition, the board-housing case includes two busbars 7 for supplying electrical power to the electrical motor which drives the pump. Each of the busbars 7 is an electrical connecting member which is made by forming a conducting metal plate into a predetermined shape with press working.

A board-side terminal portion 71 is formed at an end of each of the busbars 7 and extends substantially orthogonally to the surface of the board 5. The board-side terminal portion 71 is attached by soldering to a portion of the board 5 at the solenoid housing 32 side with respect to the joint portion 34. A connector-side terminal portion 72 is formed at the other end of each of the busbars 7 and extends substantially orthogonally to the plane of the board 5. The connector-side terminal portion 72 is located in the connector housing 33.

The board-side terminal portion 71 and the connector-side terminal portion 72 are connected with a main body 73 of each busbar 7. The main body 73 is a plate and is hereinafter referred to as a busbar main body 73. The busbar main body 73 includes a non-reinforcement plate portion 731 and reinforcement plate portions 732. The plane of the non-reinforcement plate portion 731 is parallel to the plane of the board 5. The longitudinal direction of each reinforcement plate portion 732 is substantially parallel to the alignment direction Z. In addition, the plane of each reinforcement plate portion 732 is substantially parallel to the alignment direction Z and is substantially orthogonal to the plane of the board 5.

The non-reinforcement plate portion 731 is located all across the busbar main body 73. In other words, the non-reinforcement plate portion 731 is located from the board-side terminal portion 71 to the connector-side terminal portion 72. The reinforcement plate portions 732 are located at a limited portion of the busbar main body 73. At each area in the busbar main body 73 where the reinforcement plate portions 732 are located, the busbar main body 73 has a U-shaped cross section as viewed in the alignment direction Z. An intermediate part of the U-shaped cross section corresponds to the non-reinforcement plate portion 731. Plates at both ends of the U-shape correspond to the reinforcement plate portions 732. The reinforcement plate portions 732 extend from the non-reinforcement plate portion 731 toward the board 5.

The busbar main body 73 is formed by insert molding in the case main body 3, and both of the non-reinforcement plate portion 731 and reinforcement plate portions 732 are formed by insert molding at least in a resin portion of the joint portion 34. The resin portion is a part of the joint portion 34 made of resin. More specifically, the reinforcement plate portions 732 continuously extend a full width W, where the joint portion width W is a width of the joint portion 34 in the alignment direction Z.

In the present embodiment, a residual stress is generated in forming the case main body 3 at the joint portion 34 or near the joint portion 34. The residual stress generates a bending moment which causes deformation of the case main body 3 around the joint portion 34. Since the planes of the reinforcement plate portions 732 are parallel to a plane including the line of action of the bending moment, the reinforcement plate portions 732 are highly stiff against the bending moment. Therefore, the reinforcement plate portions 732 can surely resist against the bending moment. Therefore, the reinforcement plate portions 732 can suppress the deformation of the case main body 3 in forming the case main body 3. As a result, it is possible to manufacture the case main body 3 with a high dimensional accuracy. In addition, reliability of sealing between the case main body 3 and the cover is improved since the cover 4 is attached to the case main body 3 which has a high dimensional accuracy.

Moreover, even when heat of an engine (not shown) of the vehicle acts as a cause of deformation of the case main body 3, the deformation is suppressed by the reinforcement plate portions 732. Therefore, a stress generated at contacting portions between the connector terminals 6 and the board 5 is suppressed and solder cracking at the contacting portions is prevented.

In the present embodiment, the reinforcement plate portions 732 are located all across the joint portion width W.

However, the reinforcement plate portions 732 can suppress the deformation of the case main body 3 in forming the case main body 3 even if the reinforcement plate portions 732 are located only at a limited portion of the joint portion width W.

Second Embodiment

Figure 4:
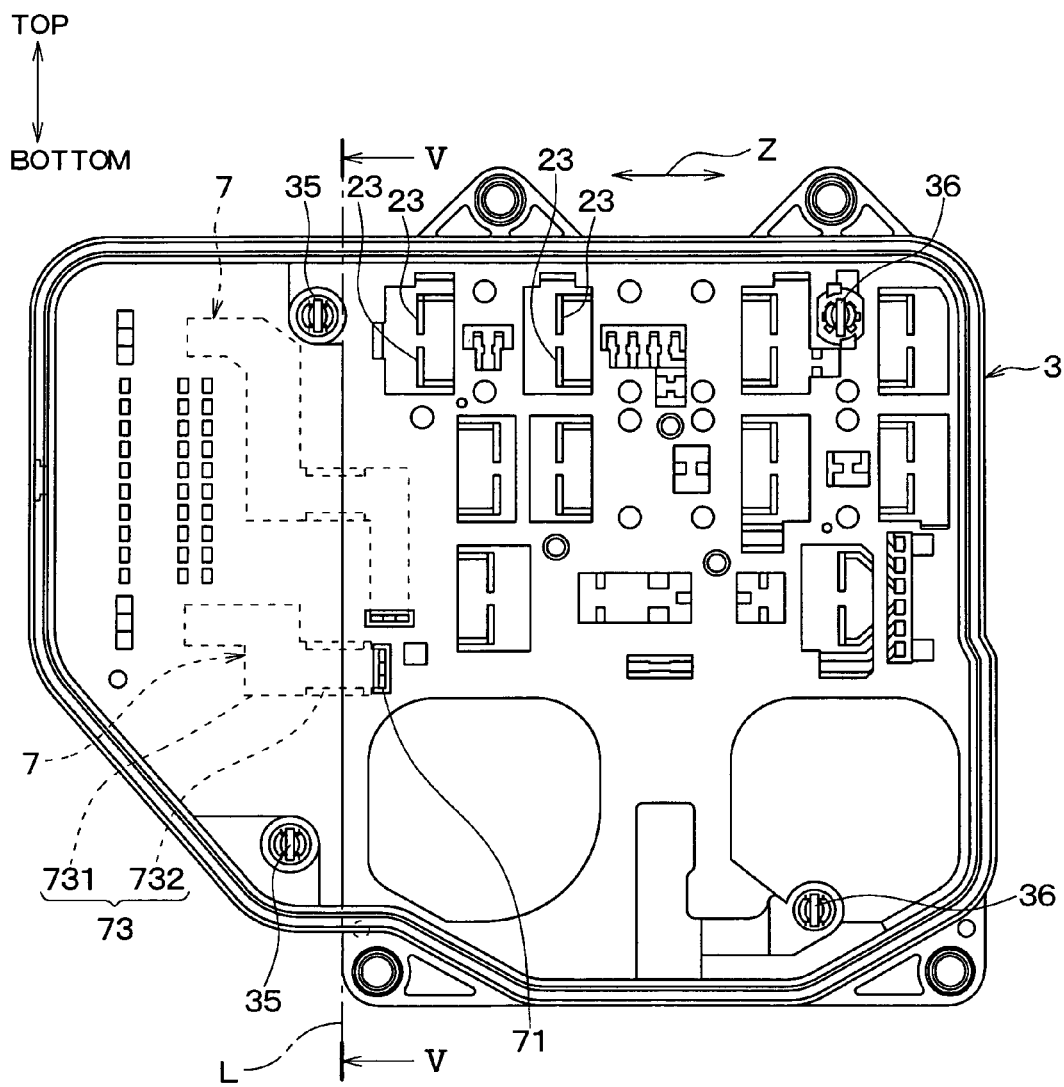
FIG. 4 is a plan view showing a fluid pressure control device including a board-housing case according to a second embodiment of the present invention in a state where a board and a cover are removed.
Figure 5:
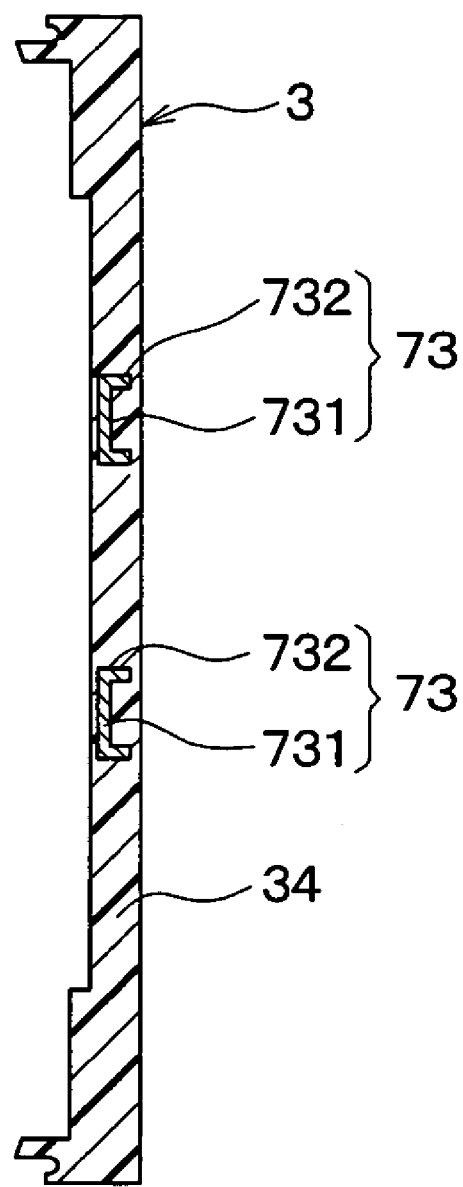
FIG. 5 is a cross sectional view taken along a line V-V of FIG. 4.

A second embodiment of the present invention is described below with reference to FIGS. 4 and 5. A part shown in this embodiment is identical or equivalent to a part in the first embodiment if the same reference numeral is applied to the both parts. Descriptions for such a part are omitted in this embodiment.

In the first embodiment, the reinforcement plate portions 732 extend from the non-reinforcement plate portion 731 toward the board 5 as shown in FIG. 3. In contrast, the reinforcement plate portions 732 in the present embodiment extend from the non-reinforcement plate portion 731 in the direction away from the board 5 as shown in FIGS. 4 and 5.

Third Embodiment

Figure 6:
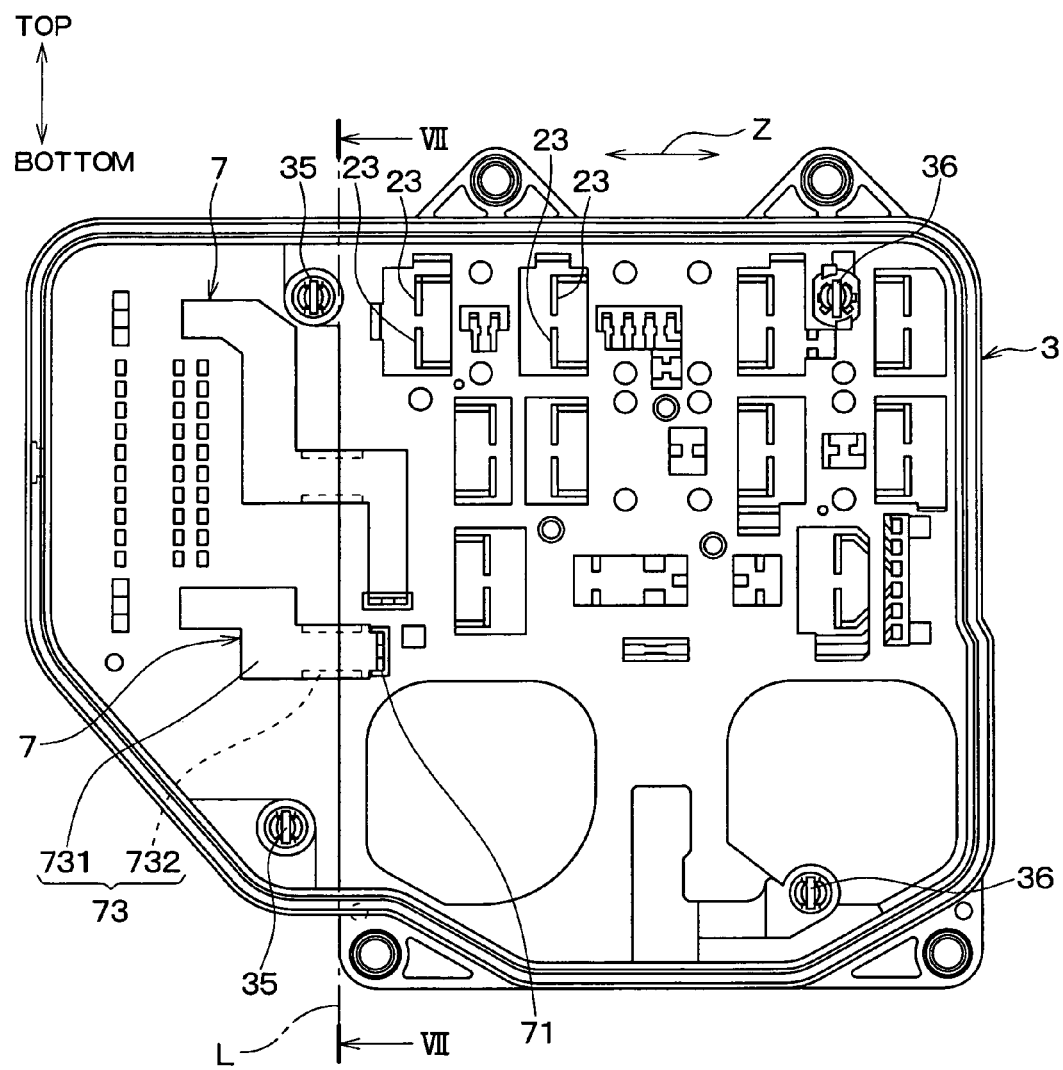
FIG. 6 is a plan view showing a fluid pressure control device including a board-housing case according to a third embodiment of the present invention in a state where a board and a cover are removed.
Figure 7:
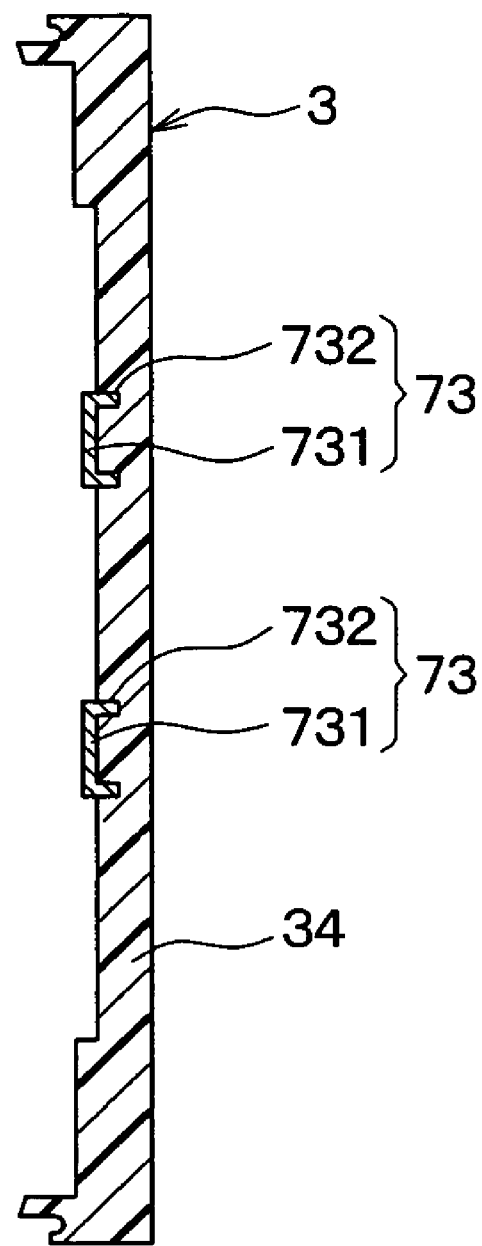
FIG. 7 is a cross sectional view taken along a line VII-VII of FIG. 6.

A third embodiment of the present invention is described below with reference to FIGS. 6 and 7. A part shown in this embodiment is identical or equivalent to a part in the above embodiments if the same reference numeral is applied to the both parts. Descriptions for such a part are omitted in this embodiment.

In the first and second embodiments, both of the non-reinforcement plate portion 731 and the reinforcement plate portions 732 are formed by insert molding at least in the resin portion of the joint portion 34. In this embodiment, only the reinforcement plate portions 732 out of the non-reinforcement plate portion 731 and the reinforcement plate portions 732 are formed by insert molding at least in the resin portion of the joint portion 34. In other words, the reinforcement plate portions 732 are formed by insert molding at lest in the resin portion of the joint portion 34 while the non-reinforcement plate portion 731 is not. Therefore, the non-reinforcement plate portion 731 is exposed at the exterior of the case main body 3. The non-reinforcement plate portion 731 can therefore be easily used to support the corresponding busbar 7 in a process of insert molding.

Fourth Embodiment

Figure 8:
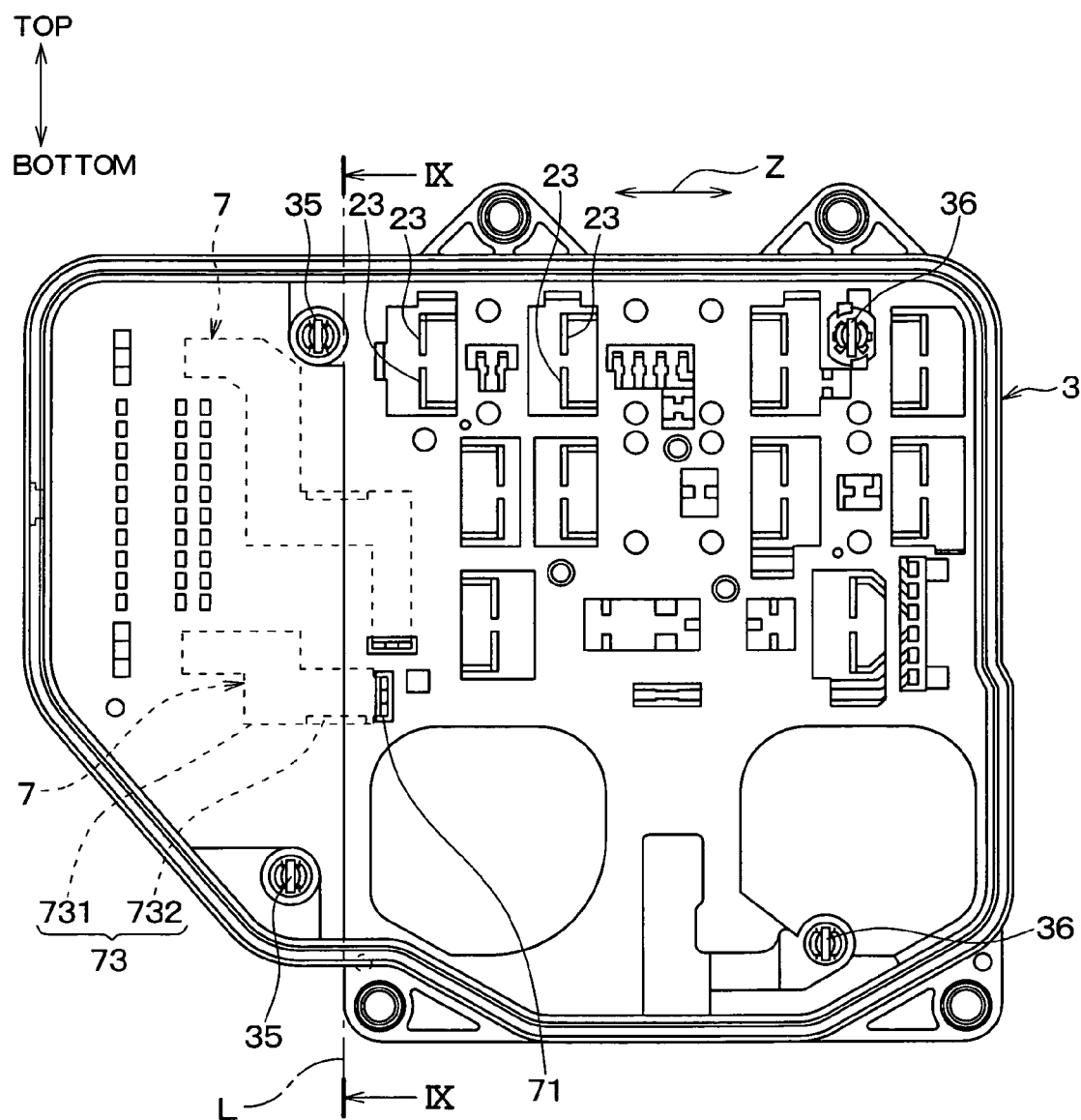
FIG. 8 is a plan view showing a fluid pressure control device including a board-housing case according to a fourth embodiment of the present invention in a state where a board and a cover are removed.
Figure 9:
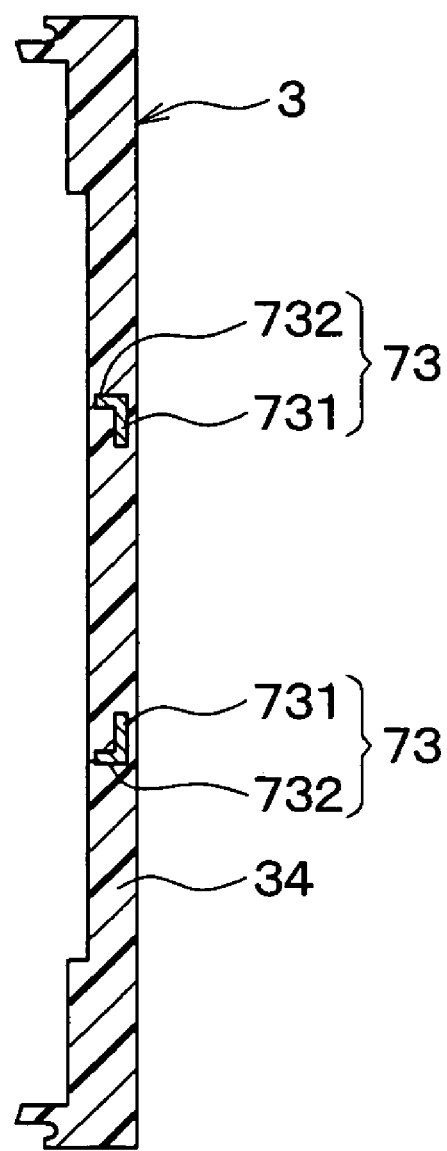
FIG. 9 is a cross sectional view taken along a line IX-IX of FIG. 8.

A fourth embodiment of the present invention is described below with reference to FIGS. 8 and 9. A part shown in this embodiment is identical or equivalent to a part in the above embodiments if the same reference numeral is applied to the both parts. Descriptions for such a part are omitted in this embodiment.

In the first to third embodiments, a cross section as viewed in the alignment direction Z has a U-shape at each portion of the busbar main body 73 where the reinforcement plate portions 732 are formed. In this embodiment, a cross section as viewed in the alignment direction Z has an L-shape at each portion of the busbar main body 73 where a reinforcement plate portion 732 is formed as shown in FIGS. 8 and 9. With this configuration, the shape of the busbar main body 73 can be simpler than that of the busbar main body 73 having the U-shaped cross section. As a result, a manufacturing cost of the busbar main body 73 can be decreased.

Fifth Embodiment

Figure 10:
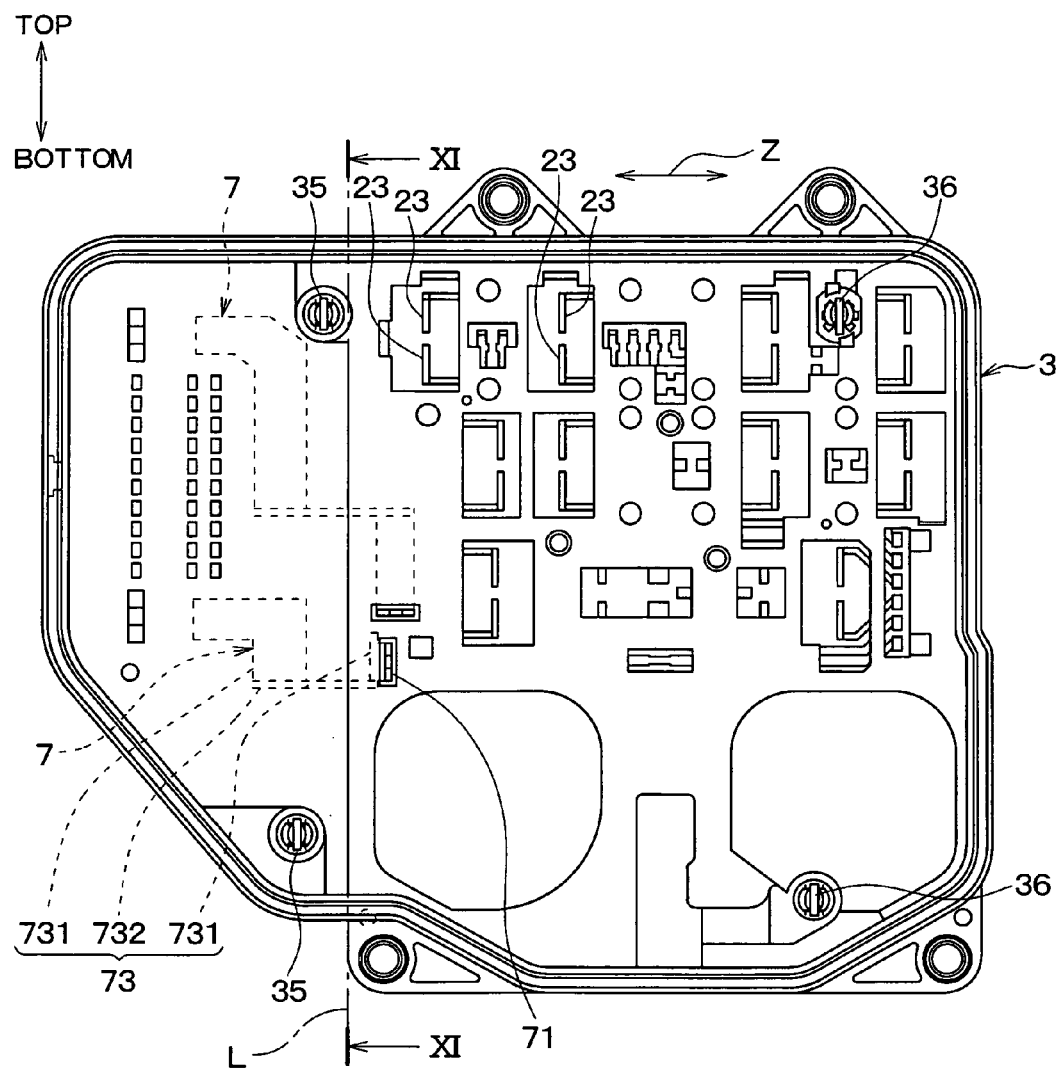
FIG. 10 is a plan view showing a fluid pressure control device including a board-housing case according to a fifth embodiment of the present invention in a state where a board and a cover are removed.
Figure 11:
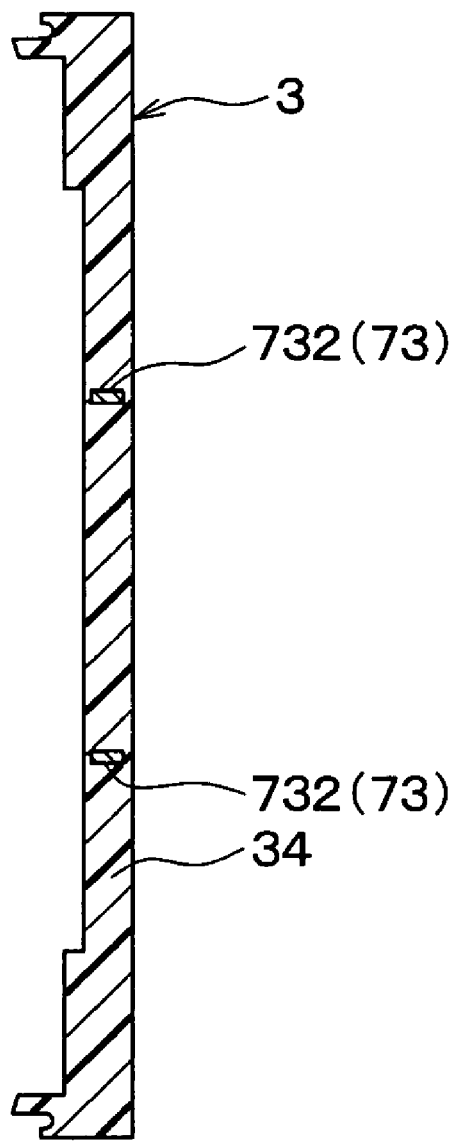
FIG. 11 is a cross sectional view taken along a line XI-XI of FIG. 10.

A fifth embodiment of the present invention is described below with reference to FIGS. 10 and 11. A part shown in this embodiment is identical or equivalent to a part in the above embodiments if the same reference numeral is applied to the both parts. Descriptions for such a part are omitted in this embodiment.

In the first to fourth embodiments, the busbar main body 73 is formed by non-reinforcement plate portion 731 and one or more reinforcement plate portion 732 at least at the resin portion of the joint portion 34. In contrast, the busbar main body 73 of the present embodiment consists only of a reinforcement plate portion 732 at least at the resin portion of the joint portion 34. The longitudinal direction of reinforcement plate portion 732 of the present embodiment is substantially parallel to the alignment direction Z. In addition, the plane of the reinforcement plate portion 732 of the present embodiment is substantially parallel to the alignment direction Z and is substantially orthogonal to the plane of the board 5 (see FIG. 3). The corresponding busbar 7 only has non-reinforcement plate portions 731 between the board-side terminal portion 71 and the reinforcement plate portion 732 and only has another non-reinforcement plate portion 731 between the connector-side terminal portion 72 (see FIG. 3) and the reinforcement plate portion 732. The non-reinforcement plate portions 731 are parallel to the plane of the board 5.

With this configuration, each portion of the busbar main body 73 located in the joint portion 34 has an I-shaped cross section as viewed in the alignment direction Z. Therefore, the shape of the busbar main body 73 can be simpler than that of the busbar main body 73 having the U-shaped cross section or the L-shaped cross section. As a result, a manufacturing cost of the busbar main body 73 can be decreased.

Sixth Embodiment

Figure 12:
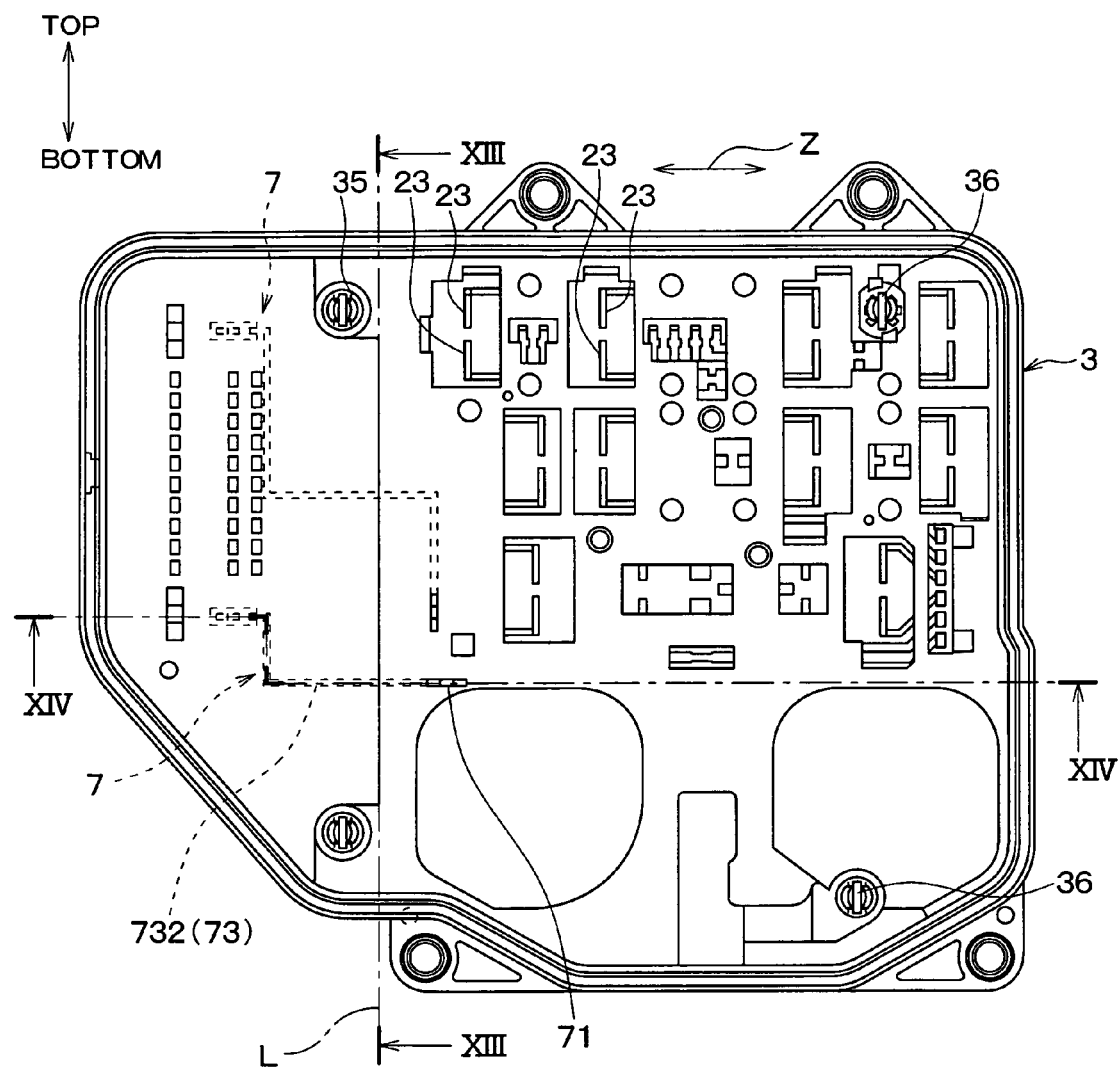
FIG. 12 is a plan view showing a fluid pressure control device including a board-housing case according to a sixth embodiment of the present invention in a state where a board and a cover are removed.
Figure 14:
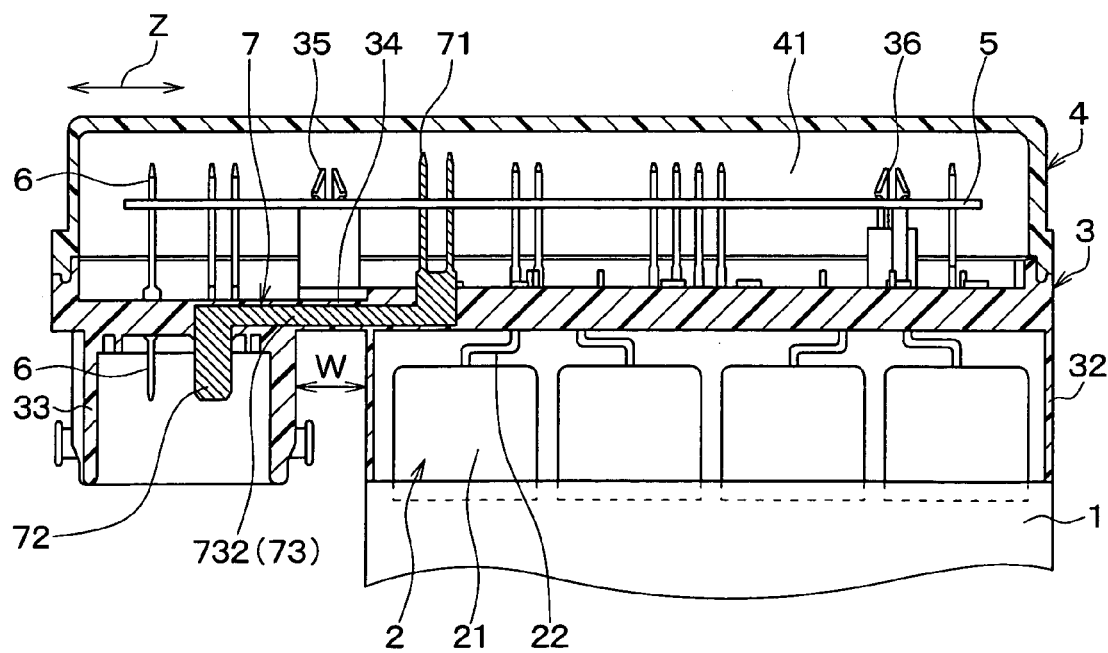
FIG. 14 is a cross sectional view taken along a line XIV-XIV of FIG. 12.

A sixth embodiment of the present invention is described below with reference to FIGS. 12 and 14. A part shown in this embodiment is identical or equivalent to a part in the above embodiments if the same reference numeral is applied to the both parts. Descriptions for such a part are omitted in this embodiment.

Figure 13:
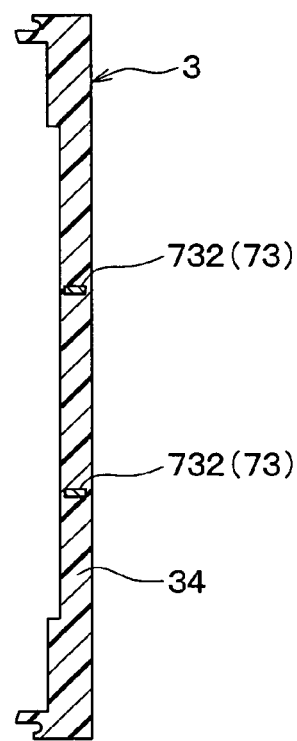
FIG. 13 is a cross sectional view taken along a line XIII-XIII of FIG. 12.

Each of the busbars 7 in the first to five embodiments includes the non-reinforcement plate portion 731 the plane of which is parallel to the plane of the board 5. In contrast, each of the busbars 7 of this embodiment is a bended flat plate which is, in its entire body, substantially orthogonal to the plane of the board 5 as shown in FIGS. 12 to 14. Therefore, the shape of each busbar 7 has a simple shape, and a manufacturing cost of the busbars 7 can be decreased.

The each busbar 7 do not have to be orthogonal to the plane of the board 5. The planes of each busbar 7 may be non-parallel to the plane of the board 5.

Seventh Embodiment

Figure 15:
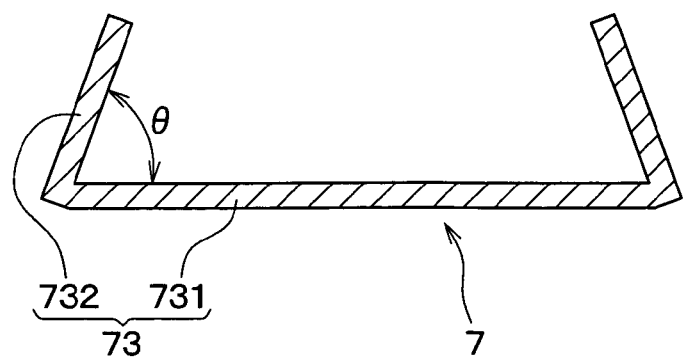
FIG. 15 is a cross sectional view of a busbar of a board-housing case according to a seventh embodiment of the present invention.

A seventh embodiment of the present invention is described below with reference to FIG. 15. FIG. 15 is a cross sectional view of a busbar 7 of a board-housing case according to this embodiment as viewed in the alignment direction Z (see FIG. 3).

As shown in FIG. 15, the busbar 7 has a U-shaped cross section as viewed in the alignment direction Z. In addition, the reinforcement plate portions 732 are tilted to the non-reinforcement plate portion 731. More specifically, an angle θ made by each reinforcement plate portion 732 and the non-reinforcement plate portion 731 is acute-angled.

While the board 5 (see FIG. 3) is located in the case main body 3 (see FIG. 3), the reinforcement plate portions 732 are tilted to the plane of the board 5. In other words, the reinforcement plate portions 732 are non-parallel to the board 5.

Eighth Embodiment

Figure 16:
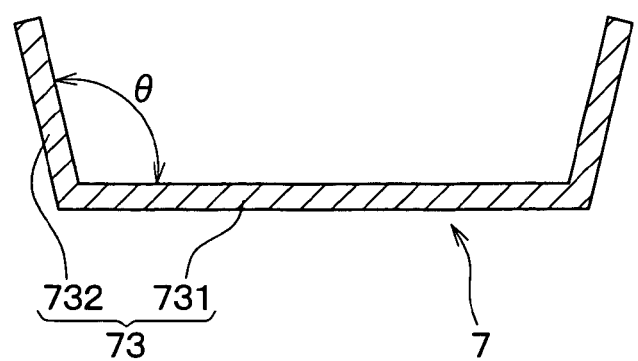
FIG. 16 is a cross sectional view of a busbar of a board-housing case according to an eighth embodiment of the present invention.

An eighth embodiment of the present invention is described below with reference to FIG. 16. FIG. 16 is a cross sectional view of a busbar 7 of a board-housing case according to this embodiment as viewed in the alignment direction Z (see FIG. 3).

As shown in FIG. 16, the busbar 7 has a U-shaped cross section as viewed in the alignment direction Z. In addition, the reinforcement plate portions 732 are tilted to the non-reinforcement plate portion 731. More specifically, an angle θ made by each reinforcement plate portion 732 and the non-reinforcement plate portion 731 is obtuse-angled.

While the board 5 (see FIG. 3) is located in the case main body 3 (see FIG. 3), the reinforcement plate portions 732 are tilted to the plane of the board 5. In other words, the reinforcement plate portions 732 are non-parallel to the board 5.

Ninth Embodiment

Figure 17:
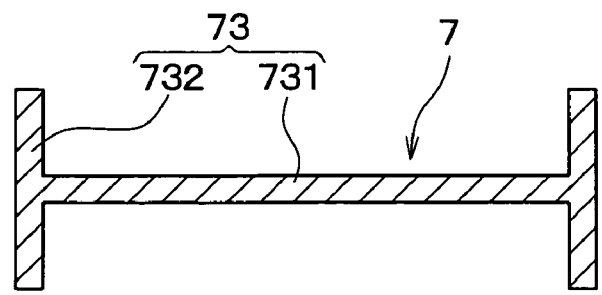
FIG. 17 is a cross sectional view of a busbar of a board-housing case according to a ninth embodiment of the present invention.

A ninth embodiment of the present invention is described below with reference to FIG. 17. FIG. 17 is a cross sectional view of a busbar 7 of a board-housing case according to this embodiment as viewed in the alignment direction Z (see FIG. 3).

As shown in FIG. 17, the busbar 7 has an H-shaped cross section as viewed in the alignment direction Z. The busbar 7 having the shape can be formed by pultrusion molding or extrusion molding.

Tenth Embodiment

Figure 18:
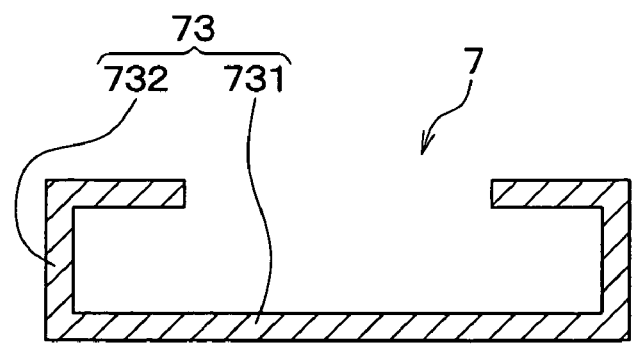
FIG. 18 is a cross sectional view of a busbar of a board-housing case according to a tenth embodiment of the present invention.
Figure 19:
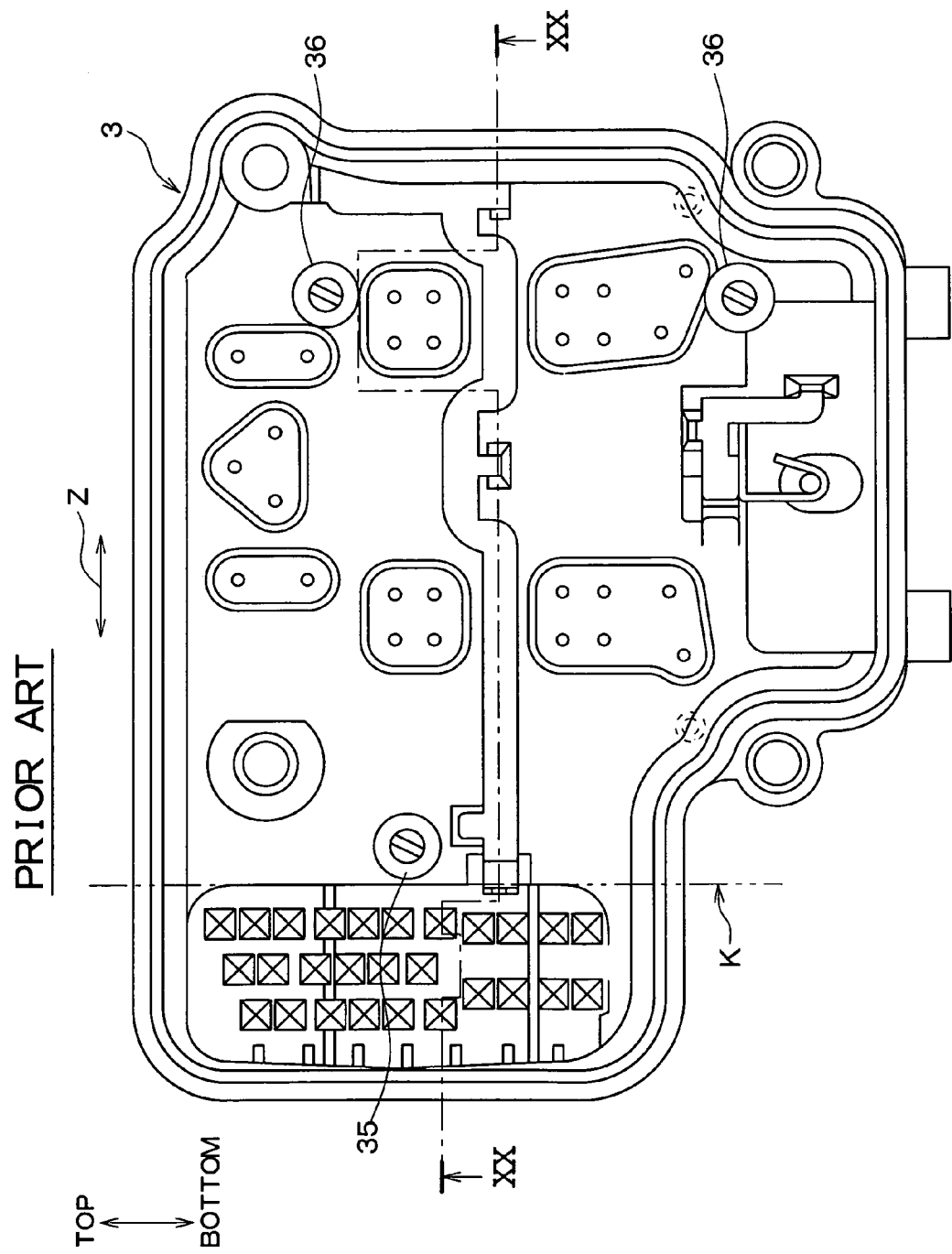
FIG. 19 is a plan view showing a conventional fluid pressure control device for a vehicle brake system in a state where a board and a cover are removed.
Figure 20:
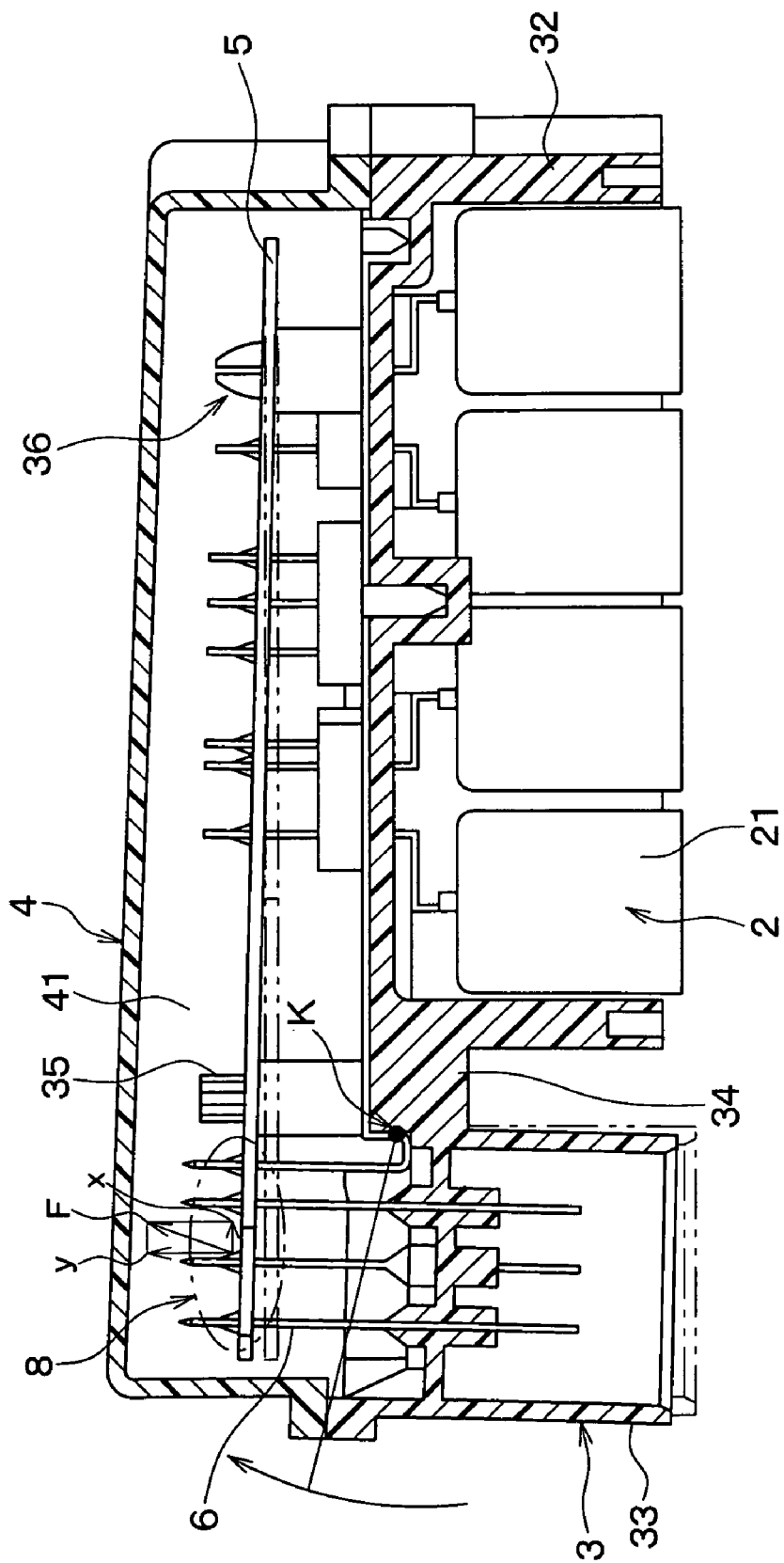
FIG. 20 is a cross-sectional view of the conventional fluid pressure control device taken along a line XX-XX of FIG. 19.

A tenth embodiment of the present invention is described below with reference to FIG. 18. FIG. 18 is a cross sectional view of a busbar 7 of a board-housing case according to this embodiment as viewed in the alignment direction Z (see FIG. 3).

As shown in FIG. 18, the busbar 7 has a C-shaped cross section as viewed in the alignment direction Z. The busbar 7 having the shape can be formed by pultrusion molding or extrusion molding.

In the above embodiment, the longitudinal direction and the plane of each the reinforcement plate portions 732 are substantially parallel to the alignment direction Z. However, each of the reinforcement plate portions 732 can be tilted to the alignment direction Z. Therefore, the longitudinal direction and the plane of each of the reinforcement plate portions 732 can be non-parallel to a reference line L shown in FIGS. 1, 4, 6, 8, 10 and 12, where the reference line L is orthogonal to the alignment direction Z and parallel to the reference line L.

Other Embodiment

Although the fluid pressure control device for the vehicle brake system is described in the above embodiments, the present invention may be also applied to fluid pressure control devices for other purposes.

What is claimed is:

1. A board-housing case, comprising:
a case main body to which a board is attached, on a surface of the board an electrical element being arranged, to the board an end portion of a connector terminal being connected, the case main body including:
a board housing for accommodating the board;
a connector housing for accommodating another end portion of the connector terminal;
a component housing for accommodating component, the component housing and the connector housing being aligned in a direction parallel to a plane of the board; and
a joint portion integrally formed with the connector housing and the component housing to connect the connector housing and the component housing, an external dimension of the joint portion in a direction orthogonal to the plane of the board is smaller than that of the connector housing and the component housing; and
a busbar having a board-side terminal portion connected with the board and a connector-side terminal portion located in the connector housing,
wherein:
the busbar includes a reinforcement plate portion, a plane of the reinforcement plate portion being non-parallel to the plane of the board, a longitudinal direction of the reinforcement plate portion being non-parallel to a reference line, the reference line being a straight line which is parallel to the plane of the board and is orthogonal to an alignment direction of the connector housing, the joint portion, and the component housing; and
the reinforcement plate portion is formed by insert molding in a resin portion of the joint portion.

2. The board-housing case according to claim 1, wherein:
the busbar includes a busbar main body for connecting the board-side terminal portion with the connector-side terminal portion; and
the busbar main body includes the reinforcement plate portion and a non-reinforcement plate portion, a plane of the non-reinforcement plate portion being parallel to the plane of the board.

3. The board-housing case according to claim 1, wherein:
the busbar includes a busbar main body for connecting the board-side terminal portion with the connector-side terminal portion; and
the busbar main body consists of the reinforcement plate portion at least at the joint portion.

4. The board-housing case according to claim 1, wherein the entire busbar main body consists of the reinforcement plate portion.

5. The board-housing case according to claim 1, wherein the reinforcement plate portion continuously extends a full width of the joint portion in the alignment direction.

6. The board-housing case according to claim 1, further including a resin cover which is connected with a side of the case main body to which the board is located, wherein the board housing includes the case main body and the cover.

7. The board-housing case according to claim 2, wherein both of the non-reinforcement plate portion and the reinforcement plate portion are formed by insert molding at least in the resin portion of the joint portion.

8. The board-housing case according to claim 2, wherein only the reinforcement plate portion out of the non-reinforcement plate portion and the reinforcement plate portion is formed by insert molding at least in the resin portion of the joint portion.

9. The board-housing case according to claim 2, wherein a portion of the busbar main body located at the joint portion has a U-shaped cross section as viewed in the alignment direction.

10. The board-housing case according to claim 2, wherein a portion of the busbar main body located at the joint portion has an L-shaped cross section as viewed in the alignment direction.

11. A fluid pressure control device comprising:
a body in which fluid flows;
a solenoid valve having a solenoid exposed to the outside of the body, the solenoid valve for allowing and blocking flow of the fluid;
a case main body to which a board is attached, on a surface of the board an electrical element being arranged, to the board an end portion of a connector terminal being connected, the case main body including:
a board housing for accommodating the board;
a connector housing for accommodating another end portion of the connector terminal;
a component housing for accommodating component, the component housing and the connector housing being aligned in a direction parallel to a plane of the board; and
a joint portion integrally formed with the connector housing and the component housing to connect the connector housing and the component housing, an external dimension of the joint portion in a direction orthogonal to the plane of the board is smaller than that of the connector housing and the component housing; and
a busbar having a board-side terminal portion connected with the board and a connector-side terminal portion located in the connector housing,
wherein:
the solenoid is located in the component housing;
the busbar includes a reinforcement plate portion, a plane of the reinforcement plate portion being non-parallel to the plane of the board, a longitudinal direction of the reinforcement plate portion being non-parallel to a reference line, the reference line being a straight line which is parallel to the plane of the board and is orthogonal to an alignment direction of the connector housing, the joint portion, and the component housing; and
the reinforcement plate portion is formed by insert molding in a resin portion of the joint portion.

12. The fluid pressure control device according to claim 11, wherein the fluid pressure control device is mounted on a vehicle, and brake fluid flows in the body.

13. A board-housing case, comprising:
a case main body to which a board is attached, on a surface of the board an electrical element being arranged, to the board an end portion of a connector terminal being connected, the case main body including:
a board housing for accommodating the board;
a connector housing for accommodating another end portion of the connector terminal;
a component housing for accommodating component, the component housing and the connector housing being aligned in a direction parallel to a plane of the board; and
a joint portion integrally formed with the connector housing and the component housing to connect the connector housing and the component housing, an external dimension of the joint portion in a direction orthogonal to the plane of the board is smaller than that of the connector housing and the component housing; and
a busbar having a board-side terminal portion connected with the board and a connector-side terminal portion located in the connector housing,
wherein:
the busbar includes a reinforcement plate portion, a plane of the reinforcement plate portion being non-parallel to a reference line, the reference line being a straight line which is parallel to the plane of the board, and is orthogonal to an alignment direction of the connector housing, the joint portion, and the component housing; and
the reinforcement plate portion is formed by insert molding in a resin portion of the joint portion.

14. A fluid pressure control device comprising:
a body in which fluid flows;
a solenoid valve having a solenoid exposed to the outside of the body, the solenoid valve for allowing and blocking flow of the fluid;
a case main body to which a board is attached, on a surface of the board an electrical element being arranged, to the board an end portion of a connector terminal being connected, the case main body including:
a board housing for accommodating the board;
a connector housing for accommodating another end portion of the connector terminal;
a component housing for accommodating component, the component housing and the connector housing being aligned in a direction parallel to a plane of the board; and
a joint portion integrally formed with the connector housing and the component housing to connect the connector housing and the component housing, an external dimension of the joint portion in a direction orthogonal to the plane of the board is smaller than that of the connector housing and the component housing; and
a busbar having a board-side terminal portion connected with the board and a connector-side terminal portion located in the connector housing,
wherein:
the solenoid is located in the component housing;
the busbar includes a reinforcement plate portion, a plane of the reinforcement plate portion being non-parallel to a reference line, the reference line being a straight line which is parallel to the plane of the board and is orthogonal to an alignment direction of the connector housing, the joint portion, and the component housing; and
the reinforcement plate portion is formed by insert molding in a resin portion of the joint portion.

\* \* \* \* \*